United States Patent [19]
Kobayashi

[11] Patent Number: 4,814,740
[45] Date of Patent: Mar. 21, 1989

[54] GLITCH OCCURENCE PREVENTION CIRCUIT FOR A DIGITAL/ANALOG CONVERTER

[75] Inventor: Kozo Kobayashi, Tokyo, Japan

[73] Assignee: Nakamichi Corporation, Kodaira, Japan

[21] Appl. No.: 27,524

[22] Filed: Mar. 18, 1987

[30] Foreign Application Priority Data

Mar. 20, 1986 [JP] Japan ................................ 61-62592

[51] Int. Cl.$^4$ ............................................. H03M 1/66
[52] U.S. Cl. .................................... 341/118; 341/144
[58] Field of Search .................. 340/347 DA, 347 CC

[56] References Cited
PUBLICATIONS

Roger L. Tokheim, "Digital Principles", 1980; Schaum's Outline Series, pp. 202-203.

Primary Examiner—William M. Shoop, Jr.
Assistant Examiner—Richard K. Blum
Attorney, Agent, or Firm—Pearne, Gordon, McCoy & Granger

[57] ABSTRACT

A glitch occurrence prevention circuit for a digital-/analog converter comprising semiconductor switching means which is turned on or off in relation to a level between a digital input voltage and a set threshold voltage, but having inconsistent timing of being turned on and off in response to the digital signal due to a switching characteristic of different rise and fall times, the glitch occurrence prevention circuit having means to normally provide a predetermined bias voltage to the digital input of the digital/analog converter so that the timing of turning on and off the semiconductor switching means is consistent.

3 Claims, 2 Drawing Sheets

GLITCH OCCURENCE PREVENTION CIRCUIT FOR A DIGITAL/ANALOG CONVERTER

BACKGROUND OF THE INVENTION

A digital/analog converter tends to produce a glitch due to a transient state of different on and off switching times of semiconductor switching means provided therein. Such glitch has to be prevented from occurring.

In one prior art reference, it has been conventionally employed that a sample holding circuit is provided at an output of the digital/analog converter to remove the glitch produced therein. However, it is difficult to control the timing and in addition thereto the construction of the circuit is disadvantageously complicated.

In another prior art, the digita/analog converter has been proposed to have means to prevent the glitch from being produced by itself. However, the commercially available digital/analog converter of such type which is formed as an integrated circuit as a practical matter still produces the glitch.

In a further prior art, the digital/analog converter has been proposed to have means to make consistent the rise and fall times of the digital input signal because the glitch is produced by the inconsistency of those times which are in turn produced due to digital signal output means supplying the digital signal to the digital/analog converter. However, this cannot effectively prevent the shifting of the timing of turning on and off the switching means in the digital/analog converter, which causes the glitch to be produced. Thus, this cannot prevent the glitch from being produced.

Finally, of late, a high speed latching circuit of complementary metal oxide semiconductor (CMOS) is commercially available which can supply the digital signal having the rise and fall times of the digital signal substantially equal to each other. Thus, it will be noted that there is not required a means to make consistent the rise and fall times of the digital signal with such high speed latching circuit. However, the glitch is also caused by either of such characteristics of one of the raising up and down times advanced more than the other because a plurality of switching means formed as a semiconductor circuit have the switching characteristic selected at each bit of the converter. Therefore, it will be noted that the glitch is produced due to such switching characteristic of the digital/analog converter. As described later in detail with reference to FIGS. 3A and 3B, the glitch can be prevented if a threshold voltage Vt can be adjusted to become $V_{t1}$ or $V_{t2}$, respectively, as indicated in FIGS. 3A and 3B. Since the switching characteristics of the switching means corresponding to the bits are not strictly consistent, the problem cannot be completely solved even though the threshold voltages are raised up or down in a uniform manner. Those commercially available digital/analog converters which are capable of adjustment are adapted to adjust the threshold voltages only in a uniform manner. Also, there is commercially available a digital/analog converter having no ability to adjust the threshold voltages. Thus, it will be noted that the glitch still cannot be prevented from occurring in case the commercially available digital/analog converter is provided in an electronic instrument.

SUMMARY OF THE INVENTION

Accordingly, it is a principal object of the invention to provide a glitch occurrence prevention circuit for a digital/analog converter which can prevent effectively a glitch from occurring.

It is another object of the invention to provide a glitch occurrence prevention circuit for a digital/analog converter to prevent a glitch from occurring merely by the addition of a simple external circuit to the converter.

In accordance with the present invention, there is provided a glitch occurrence prevention circuit for a digital/analog converter comprising a plurality of semiconductor switching means which are turned on or off on a comparison between a digital input voltage level and a set threshold voltage level, but having inconsistent timing of being turned on and off in response to the digital signal due to a switching characteristic of different rise and fall times, the glitch occurrence prevention circuit characterized by bias means to provide a predetermined bias voltage to at least one of the digital inputs of the digital/analog converter so that the timing of turning on and off said semiconductor switching means is substantially consistent.

BRIEF DESCRIPTION OF THE DRAWINGS

The above and other objects and features of the invention will be apparent from the description of the embodiments of the invention taken with the accompanying drawings in which.

DETAILED DESCRIPTION OF THE EMBODIMENTS

Figure 1:
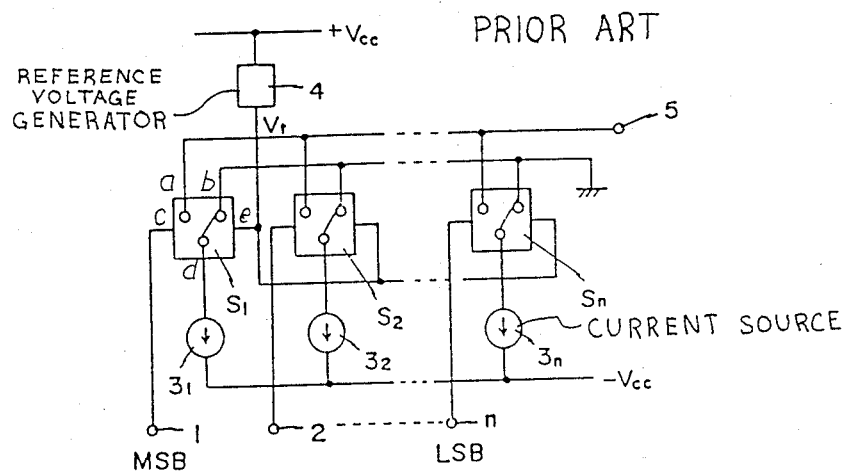
FIG. 1 is a schematic diagram of a conventional digital/analog converter.

With reference to FIG. 1 of the drawings, there is shown a conventional digital/analog converter to which may be add a glitch occurrence prevention circuit of the present invention. The digital/analog converter comprises a plurality of current sources $3_1, 3_2 \text{-- -} 3_n$ which are weighted in current according to a binary code and a plurality of switching means $S_1, S_2 \text{-- -} S_n$ having movable contacts connected in series to the current sources $3_1, 3_2 \text{-- -} 3_n$, respectively. A reference voltage generator 4 is provided to set a threshold voltage $V_t$ for the switching means $S_1, S_2 \text{-- -} S_n$. The switching means are connected to digital input terminals 1 for MSB (most significant bit), 2 ---, n for LSB (least significant bit), respectively. The switching means may be normally formed of semiconductor circuits.

Figure 2:
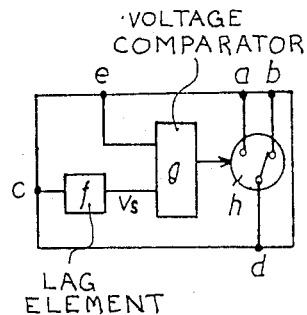
FIG. 2 is an equivalent schematic diagram of one of a a plurality of switching means used for the converter of FIG. 1.

The switching means $S_1$ as a semiconductor circuit is shown with an equivalent block in FIG. 2. The input and output terminals a through c of FIG. 2 correspond to those of the switching means $S_1$ of FIG. 1, respectively. The switching means comprises a lag element f, a voltage comparator g to compare an output voltage $V_s$ from the lag element f with the threshold voltage Vt and a turn-over switch h operated by the output signal from the voltage comparator g. The voltage comparator g and the turn-over switch h of ideal type may be used having no time loss in this equivalent circuit. The switching means $S_1$ of semiconductor circuit has a switching characteristic of the fall time of the binary-coded voltage signal of 0 and +V input to the switching means $S_1$ being more advanced than rise time thereof because of the lag element f, or a switching characteristic reverse to the former, as shown in FIGS. 3A and 3B.

Figure 4:
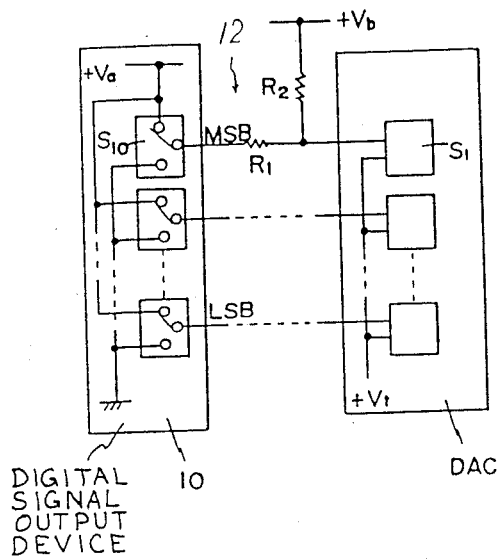
FIG. 4 is a schematic diagram of a glitch occurrence prevention circuit for the converter of FIG. 1 constructed in accordance with one of the embodiments of the invention.

The glitch occurrence prevention circuit for the digital/analog converter constructed in accordance with one embodiment of the invention will be described with respect to a section for MSB of n bits with reference to FIG. 4. In FIG. 4, DAC designates a section of the digital/analog converter while a reference numeral 10 designates a digital signal output device supplying the digital signal to the DAC. The digital signal output device 10 comprises a plurality of switching means $S_{10}$ - - - which are so operated as to be switched between a DC positive voltage Va of +5 V and earth, for example, in accordance with the digital signal to be supplied to the DAC.

The glitch occurrence prevention circuit 12 of the invention comprises bias means 13 which includes a first resistance $R_1$ of hundreds of ohms, for example, provided in a connection line between the switching means $S_1$ of the converter and the corresponding switching means $S_{10}$ of the digital signal output device 10 and a second resistance $R_2$ of kilos of ohms, for example, provided between a connection point of the switching means $S_1$ and the first resistance $R_1$ and a DC positive voltage Vb of +10 V, for example.

Figure 3A:
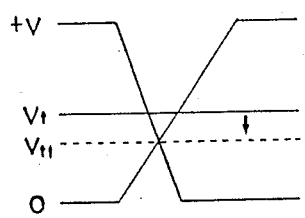
FIGS. 3A and 3B illustrate digital input signals which have different rise and fall times and set threshold voltages.
Figure 3B:
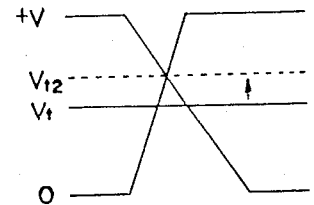
Figure 5:
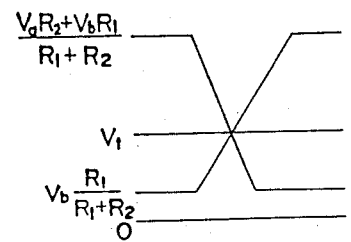
FIG. 5 illustrates a bias voltage applied to the digital input signal by means of the circuit of FIG. 4.

As aforementioned, the semiconductor switching means $S_1$ of the converter corresponding to the MSB input of the DAC is supposed to have the switching characteristic of the fall time of the digital signal more advanced than the rise time thereof as shown in FIG. 3A, which causes the glitch of the converter. The threshold voltage $V_t$ of the threshold voltage generator 4 is set as +2.5 V which corresponds to $V_a/2$. According to the invention, the DC positive voltage Vb and the values of the first and second resistances $R_1$ and $R_2$ are so set that the relation of the switching characteristics of rise and fall times of the switching means $S_1$ and the threshold voltage Vt is provided as shown in FIG. 5. As noted from FIG. 5, the timing of raising up and down of the digital signal is made consistent, which prevents the glitch which otherwise would occur due to the switching characteristic of the DAC. It should be noted that the first resistance $R_1$ together with a parasitic capacity forms a time constant circuit which allows the fall time characteristic to slightly approach the rise time. It will be easily understood by those skilled in the art that the switching characteristic of the converter reverse to the aforementioned characteristic as shown in FIG. 3B can be adjusted in a similar manner, which will be omitted from the description.

Ideally, the glitch occurrence prevention circuits 12 may be preferably provided at all the input terminals of the DAC converting the signals of n bits, but since the degree of the glitch largely depends on the bits of MSB side, they may be effectively provided only at the input terminals for the upper side bits.

Figure 6:
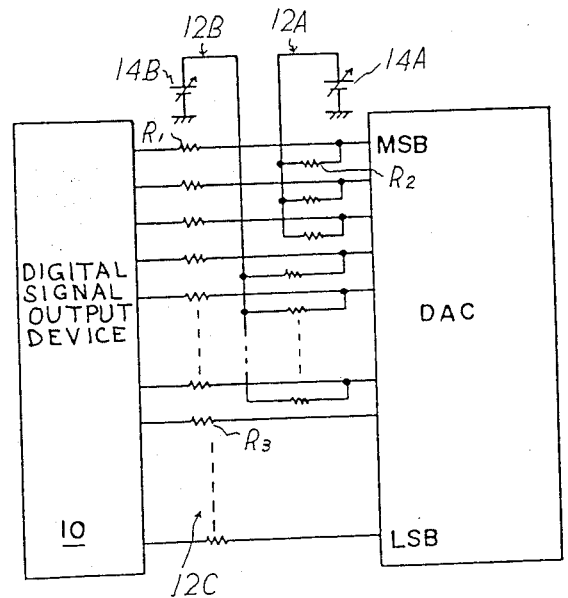
FIG. 6 is a schematic diagram of a glitch occurrence prevention circuit constructed in accordance with another embodiment.

FIG. 6 shows the glitch occurrence prevention circuit 12 constructed in accordance with another embodiment of the invention. The glitch occurrence prevention circuit 12 may be divided into three groups 12A, 12B and 12C of upper, middle and lower bits. The upper and middle bit groups 12A and 12B have the variable DC positive voltage source 14A and 14B to generate the variable DC voltage $V_b$ while the lower bit group 12C has no DC positive voltage source and therefore no second resistance $R_2$. The upper and middle bit groups 12A and 12B have the values of the first and second resistances $R_1$ and $R_2$ and the DC positive voltages Vb set based on test data of a plurality of samples of commercially available digital/analog converters. The lower bit group 12C may have the value of the resistances $R_3$ set corresponding to variation in the switching characteristics of the corresponding section of the converter. It should be noted that the ratio of division of two resistances for each of the upper and middle bit groups should be equal to that for the other groups.

It should be also noted that the adjustment of voltage should be made using the digital signal corresponding to the analog signal of relatively high frequency to which the upper bit group is sensitive while this adjustment should be made using the digital signal corresponding to the analog signal of relatively low frequency to which the middle bit group is sensitive so that the value of voltage making the glitch minimum can be obtained.

While some preferred embodiments of the invention have been illustrated and described with reference to the accompanying drawings, it will be understood by those skilled in the art that they are by way of example, and that various changes and modifications may be made without departing from the spirit and scope of the invention, which is intended to be defined only by the appended claims.

What is claimed is:

1. A glitch occurrence prevention circuit for a digital/analog converter comprising a plurality of semiconductor switching means which are turned on or off on a comparison between a digital input voltage level and a set threshold voltage level, but having different timing of being turned on and off in response to variation in said digital input voltage level due to a switching characteristic of different rise and fall times, the glitch occurrence prevention circuit characterized by an adjustable bias means to provide a predetermined bias voltage to at least one of the digital inputs of the digital/analog converter so that the times at which said semiconductor switching means is turned on and off in response to variations in said digital input voltage level are substantially consistent.

2. A glitch occurrence prevention circuit for a digital/analog converter as set forth in claim 1, wherein said bias means includes a voltage source to output said adjustable bias voltage, a first resistance connected between said voltage source and a digital input terminal of said digital/analog converter and a second resistance connected to said digital input terminal so as to apply a digital signal thereto.

3. A glitch occurrence prevention circuit for a digital/analog converter as set forth in claim 2, wherein said digital/analog converter has at least an upper and a lower bit group of digital inputs, and wherein said bias means is connected to apply an adjustable output voltage common to a plurality of first resistances for at least an upper bit group of said digital inputs of said digital/analog converter.

* * * * *

UNITED STATES PATENT AND TRADEMARK OFFICE
CERTIFICATE OF CORRECTION

PATENT NO. : 4,814,740
DATED : March 21, 1989
INVENTOR(S) : Kozo Kobayashi It is certified that error appears in the above-identified patent and that said Letters Patent is hereby corrected as shown below:

Column 1, line 18 after "art" insert --reference--.

Column 1, line 18 "digita/" should be --digital/--.

Column 1, lines 44 & 45 "raising up and down" should be --rise and fall--.

Column 2, line 54 "add" should be --added--.

Column 3, line 1 "c" should be --e--.

Column 3, line 8 after "switch" add --h--.

Column 3, line 12 after "coded" add --digital--.

Column 3, line 53 "raising up and down" should be --the rise and fall times--.

Column 3, line 68 after "of" insert --the--.

Signed and Sealed this

Fifth Day of December, 1989

*Attest:*

JEFFREY M. SAMUELS

*Attesting Officer*     *Acting Commissioner of Patents and Trademarks*